(12) United States Patent
Kato et al.

(10) Patent No.: US 8,716,834 B2
(45) Date of Patent: May 6, 2014

(54) SEMICONDUCTOR DEVICE INCLUDING ANTENNA

(75) Inventors: Kiyoshi Kato, Atsugi (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 400 days.

(21) Appl. No.: 11/792,372

(22) PCT Filed: Dec. 21, 2005

(86) PCT No.: PCT/JP2005/023994
§ 371 (c)(1),
(2), (4) Date: Jun. 6, 2007

(87) PCT Pub. No.: WO2006/068286
PCT Pub. Date: Jun. 29, 2006

(65) Prior Publication Data
US 2008/0087990 A1    Apr. 17, 2008

(30) Foreign Application Priority Data
Dec. 24, 2004  (JP) .................................. 2004-374913

(51) Int. Cl.
*H01L 21/02* (2006.01)
(52) U.S. Cl.
USPC ...................... 257/534; 257/E31.002; 438/22
(58) Field of Classification Search
USPC ............................ 257/534, E31.002; 438/22
See application file for complete search history.

(56) References Cited

U.S. PATENT DOCUMENTS

| 6,496,113 | B2 * | 12/2002 | Lee et al. .................... 340/572.7 |
| 6,509,217 | B1 * | 1/2003 | Reddy ............................ 438/153 |
| 6,838,773 | B2 | 1/2005 | Hino et al. |
| 7,557,436 | B2 | 7/2009 | Mizuno et al. |
| 7,652,363 | B2 | 1/2010 | Mizuno et al. |

(Continued)

FOREIGN PATENT DOCUMENTS

| EP | 0 347 853 | 12/1989 |
| EP | 1453088 A | 9/2004 |

(Continued)

OTHER PUBLICATIONS

International Search Report (Application No. PCT/JP2005/023994) dated Apr. 11, 2006.

(Continued)

*Primary Examiner* — Thao Le
*Assistant Examiner* — Matthew Gordon
(74) *Attorney, Agent, or Firm* — Eric J. Robinson; Robinson Intellectual Property Law Office, P.C.

(57) ABSTRACT

A semiconductor device that can prevent reduction in the amplitude of electromagnetic waves transmitted from a reader/writer, and can prevent heating of an element forming layer due to a change in a magnetic field. The semiconductor device of the invention has an element forming layer formed over a substrate, and an antenna connected to the element forming layer. The element forming layer has at least wires such as a power supply wire and a ground wire that are arranged in a non-circular shape. The element forming layer and the antenna may be provided so as to overlap each other at least partially. The antenna may be provided above or below the element forming layer.

12 Claims, 12 Drawing Sheets

(56) References Cited

U.S. PATENT DOCUMENTS

| | | |
|---|---|---|
| 7,973,313 B2 | 7/2011 | Arai et al. |
| 2002/0132383 A1* | 9/2002 | Hiroki et al. ............... 438/17 |
| 2003/0006414 A1* | 1/2003 | Takemura et al. ........... 257/72 |
| 2003/0132430 A1* | 7/2003 | Tsai ............................. 257/2 |
| 2004/0212017 A1* | 10/2004 | Mizuno et al. ............ 257/368 |
| 2005/0133790 A1 | 6/2005 | Kato |
| 2005/0140495 A1 | 6/2005 | Yamazaki et al. |
| 2005/0168235 A1 | 8/2005 | Arai et al. |
| 2005/0168339 A1 | 8/2005 | Arai et al. |
| 2005/0174845 A1 | 8/2005 | Koyama et al. |
| 2005/0180187 A1 | 8/2005 | Koyama |
| 2005/0192129 A1 | 9/2005 | Kuwabara |
| 2006/0068536 A1 | 3/2006 | Yamazaki |
| 2006/0121694 A1 | 6/2006 | Tamura |
| 2006/0134918 A1 | 6/2006 | Fujii et al. |
| 2006/0214280 A1 | 9/2006 | Mizuno et al. |
| 2011/0223966 A1 | 9/2011 | Arai et al. |

FOREIGN PATENT DOCUMENTS

| | | |
|---|---|---|
| JP | 62-054950 | 3/1987 |
| JP | 01-251639 | 10/1989 |
| JP | 06-053449 A | 2/1994 |
| JP | 2001-092936 | 4/2001 |
| JP | 2001-284460 A | 10/2001 |
| JP | 2003-078023 A | 3/2003 |
| JP | 2003-109819 A | 4/2003 |
| JP | 2004-282050 A | 10/2004 |
| WO | WO 03/015169 | 2/2003 |
| WO | WO-03/015169 | 12/2004 |

OTHER PUBLICATIONS

Written Opinion (Application No. PCT/JP2005/023994) dated Apr. 11, 2006.

* cited by examiner

Prior Art

Prior Art

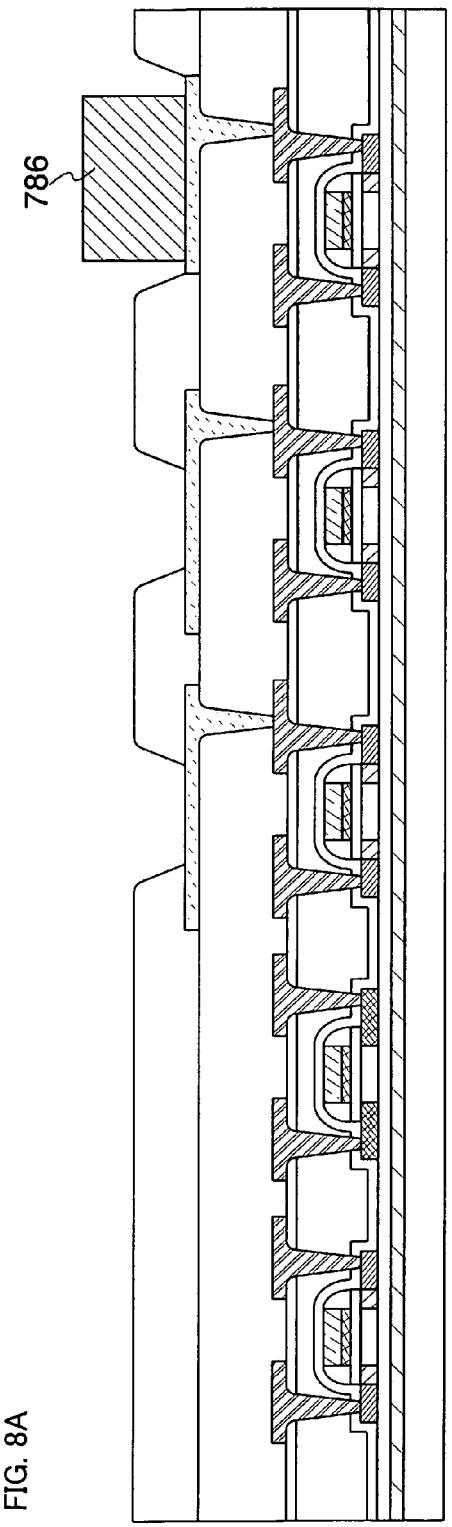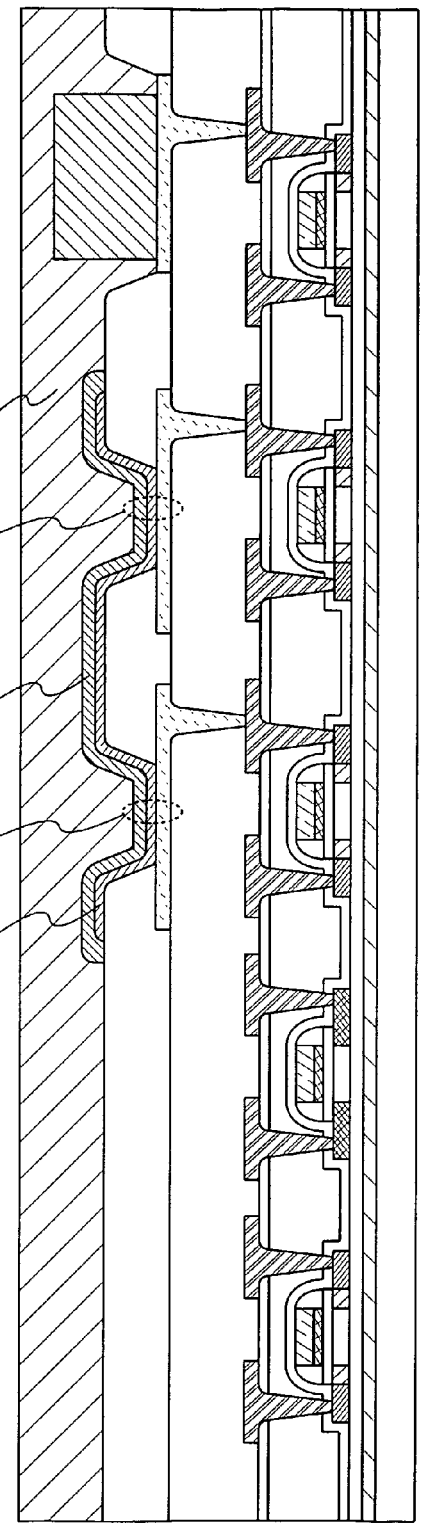
FIG. 8A
FIG. 8B

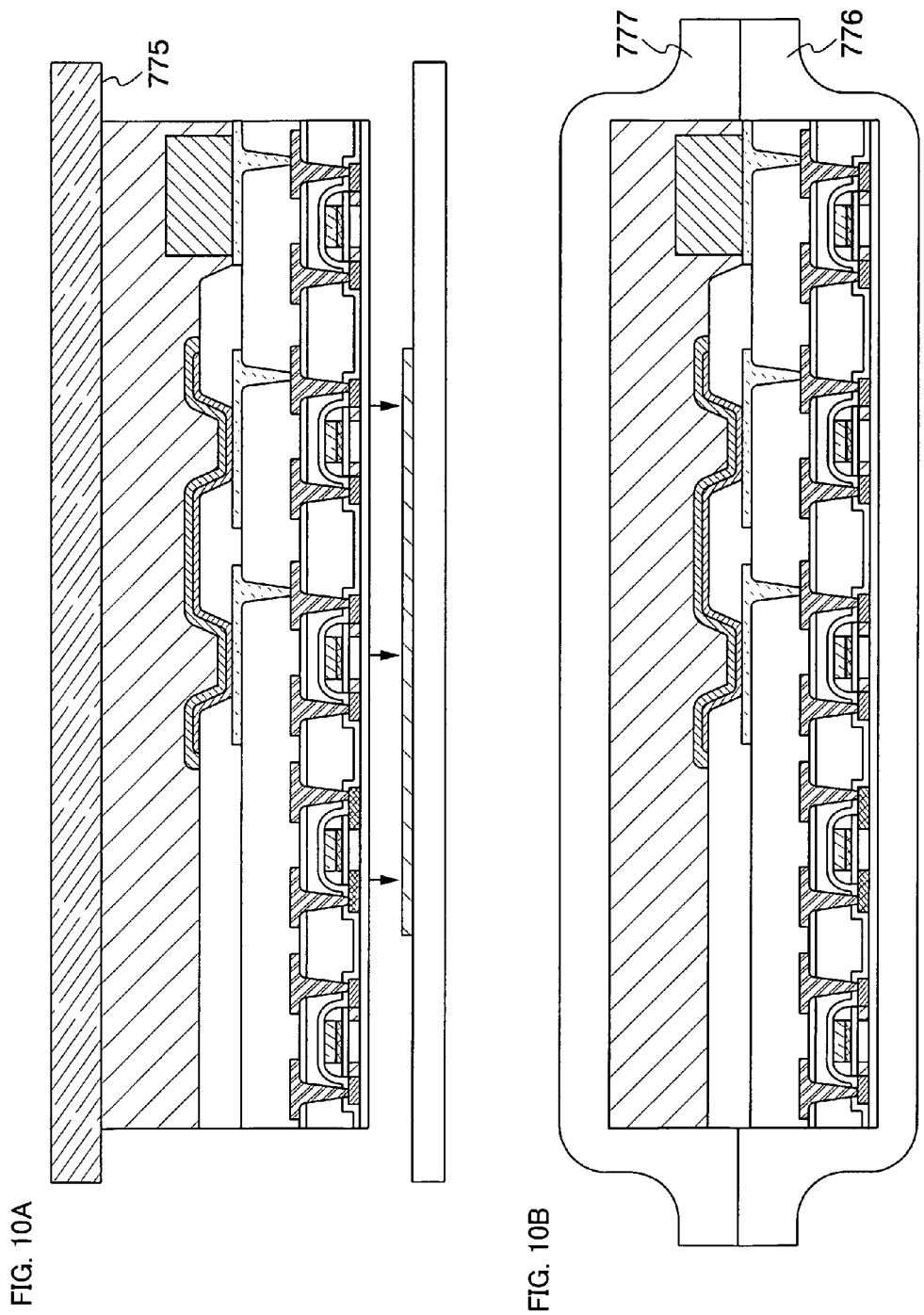

SEMICONDUCTOR DEVICE INCLUDING ANTENNA

TECHNICAL FIELD

The present invention relates to a semiconductor device capable of communicating data wirelessly.

BACKGROUND ART

In recent years, identification technology where an ID (identification number) is assigned to each object so as to reveal data thereon such as the history has been attracting attention, which is utilized for production management and the like. Above all, semiconductor devices capable of communicating data wirelessly have been developed. Such semiconductor devices include an RFID (Radio Frequency Identification) tag (also called an ID tag, an IC tag, an IC chip, an RF (Radio Frequency) tag, a wireless tag, an electronic tag, or a wireless chip), and the like have been introduced into companies, the market and the like.

In general, many of RFID tags that have been put into practical use so far have, for example, as shown in FIG. 4A, a configuration where an element forming layer 72 (also called an IC (Integrated Circuit) chip) including a circuit constituted by a transistor and the like, and an antenna 71 are formed over a substrate 70. Such semiconductor devices can communicate data with a reader/writer using electromagnetic waves. Specifically, a magnetic field passing through an antenna coil is changed by electromagnetic waves emitted from a reader/writer and induced electromotive force is generated, thereby an element forming layer is operated. Further, load modulation of the antenna by means of a signal outputted from the element forming layer allows a signal to be transmitted to the reader/writer.

DISCLOSURE OF INVENTION

On the element forming layer 72, a power supply wire, a ground wire and the like are provided so as to surround a plurality of functional circuits in order to supply enough power to the plurality of functional circuits. Specifically, as shown in FIG. 4B, wires such as a power supply wire 73 and a ground wire 74 are provided so as to surround a power supply circuit 75, functional circuits 76 and 77, and the like, and arranged in a circular shape.

However, in the semiconductor device communicating data wirelessly, problems may occur in the case of using electromagnetic induction, depending on the shape of the wires and the like formed in the element forming layer 72. For example, if wires such as the power supply wire and the ground wire are arranged in a circular shape as shown in FIG. 4B, when a magnetic field is changed in a region surrounded by the power supply wire, the ground wire and the like, current (eddy current) is generated in these wires so as to compensate for the change in the magnetic field. Specifically, for example, when electromagnetic waves are transmitted from the reader/writer to the semiconductor device as shown in FIG. 5A (here, when a magnetic field is generated from above the substrate 70 to below it), a power supply voltage is generated in the element forming layer 72 via the antenna 71, while a current 78 is generated in the power supply wire 73 and the ground wire 74, which are arranged in a circular shape on the element forming layer 72, so as to compensate for the change in the magnetic field. Accordingly, a magnetic field is generated from below the substrate to above it (FIG. 5B).

As a result, the amplitude of electromagnetic waves emitted from the reader/writer is reduced, which causes problems such as reduction in the communication distance, and heating of the element forming layer since Joule heat is generated in the element forming layer due to a current generated in the wires and the like and a part of electromagnetic energy is used as heat energy.

In view of the foregoing, the invention provides a semiconductor device that can prevent reduction in the amplitude of electromagnetic waves transmitted from a reader/writer, and can prevent heating of an element forming layer due to a change in a magnetic field.

In order to solve the aforementioned problems, the invention will take the following measures. A semiconductor device of the invention has an element forming layer formed over a substrate, and an antenna connected to the element forming layer. The element forming layer has a power supply wire and a ground wire that are arranged in a non-circular shape. Note that in the invention, the circular shape includes not only a curved shape, but also an elliptic shape, a rectangular shape, and a shape consisting of a wire whose terminals are connected to each other or a wire that surrounds an area once or more. That is to say, a wire arranged in a circular shape includes a wire arranged in a spiral or a coil as well as a curved wire and a rectangular wire. In addition, the aforementioned shapes may be arranged in three dimensions. Shapes other than the circular shape are referred to as non-circular shapes.

According to another structure of the invention, a semiconductor device has an element forming layer formed over a substrate, and an antenna connected to the element forming layer. The element forming layer and the antenna overlap each other at least partially. The element forming layer has a power supply wire and a ground wire that are arranged in a non-circular shape. The antenna may be provided above or below the element forming layer.

In the aforementioned structure of the invention, wires such as the power supply wire and the ground wire may be arranged in a U-shape, a comb shape, a cross shape or the like.

According to another structure of the invention, a semiconductor device has a semiconductor film formed over a substrate, a gate electrode formed over the semiconductor film with a gate insulating film interposed therebetween, an insulating film formed over the gate electrode, a source or drain electrode formed over the insulating film and connected to a source or drain region of the semiconductor film, wires such as a power supply wire and a ground wire, which are electrically connected to the source or drain electrode, and an antenna electrically connected to the wires. The wires are arranged in a non-circular shape.

According to another structure of the invention, a semiconductor device has a semiconductor film formed over a substrate, a gate electrode formed over the semiconductor film with a gate insulating film interposed therebetween, an insulating film formed over the gate electrode, a source or drain electrode formed over the insulating film and connected to a source or drain region of the semiconductor film, wires such as a power supply wire and a ground wire, which are formed over the source or drain electrode and electrically connected to the source or drain electrode, and an antenna that overlaps the semiconductor film at least partially and is electrically connected to the wires. The wires are arranged in a non-circular shape.

When wires such as a power supply wire and a ground wire are arranged in a non-circular shape, it is possible to suppress a current generated in the wires such as a power supply wire and a ground wire due to a change in a magnetic field, and to prevent reduction in the amplitude of electromagnetic waves transmitted from a reader/writer. By suppressing a current that is generated in a power supply wire and a ground wire due to a change in a magnetic field, heating of an element forming layer can be prevented.

BRIEF DESCRIPTION OF DRAWINGS

FIGS. 8A and 8B are diagrams each showing an example of manufacturing steps of the semiconductor device of the invention.

FIGS. 10A and 10B are diagrams each showing an example of manufacturing steps of the semiconductor device of the invention.

BEST MODE FOR CARRYING OUT THE INVENTION

Figure 1A:
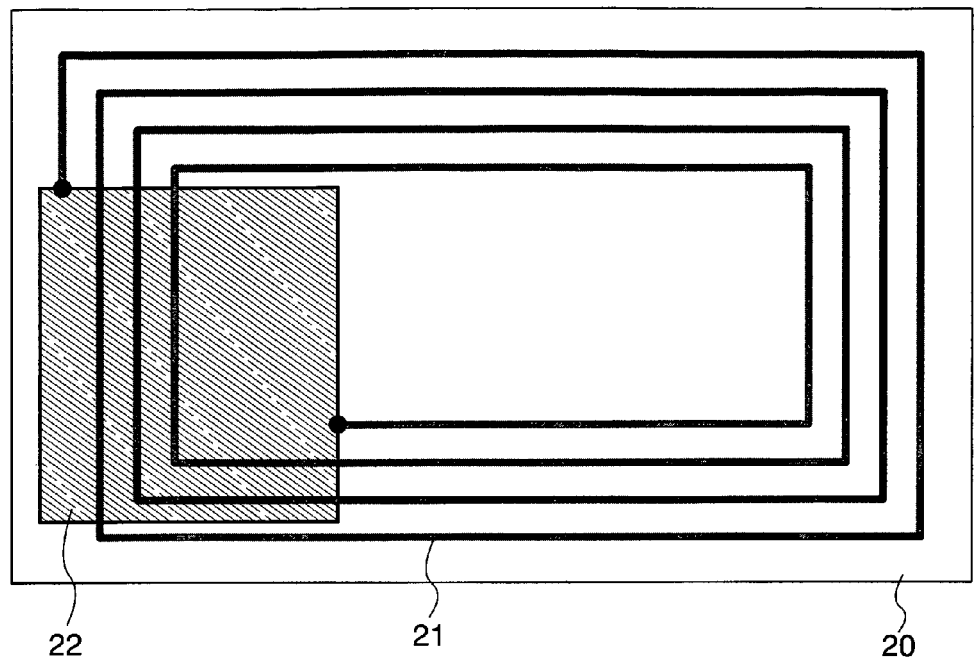
FIGS. 1A and 1B are diagrams each showing a configuration example of a semiconductor device of the invention.

Although the invention will be described by way of Embodiment Modes with reference to the accompanying drawings, it is to be understood that various changes and modifications will be apparent to those skilled in the art. Therefore, unless such changes and modifications depart from the scope of the invention, they should be construed as being included therein. Note that in the description of the invention, the identical portions are denoted by the identical reference numerals in some cases.

[Embodiment Mode 1]

A configuration example of a semiconductor device of the invention is described with reference to FIGS. 1A and 1B. Note that FIG. 1A is a top plan view of the semiconductor device while FIG. 1B is a schematic view of an element forming layer in the semiconductor device.

Figure 1B:
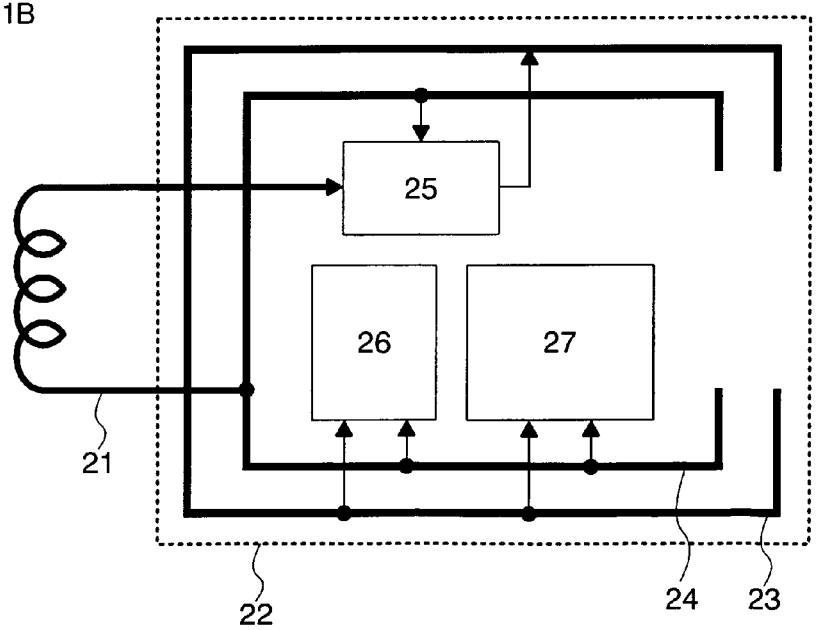

As shown in FIG. 1A, the semiconductor device shown in this embodiment mode has an element forming layer 22 and an antenna 21, which are formed over a substrate 20. The element forming layer 22 and the antenna 21 may be arranged in any shape; however, they are preferably arranged so as to overlap each other in view of the reduction in size of the semiconductor device. If the antenna 21 is arranged in a coil, the element forming layer 22 is preferably arranged so as to overlap the end of the antenna 21. This is to prevent the amplitude of electromagnetic waves passing through the antenna 21 from being reduced by disposing the element forming layer 22 at the center of the antenna 21.

The substrate 20 may be a glass substrate such as a barium borosilicate glass substrate and an alumino borosilicate glass substrate, a quartz substrate, a ceramic substrate, or the like. Instead, the substrate 20 may be a metal substrate such as stainless or a semiconductor substrate having a surface over which an insulating film is formed. Alternatively, the substrate 20 may be formed of a flexible synthetic resin such as plastics including PET or the like.

The element forming layer 22 has at least a transistor and a wire. The transistor can constitute all kinds of integrated circuits such as a CPU (Central Processing Unit), a memory circuit, and a microprocessor. The transistor in the element forming layer 22 may be a thin film transistor (TFT) that is provided over a glass substrate or the like, a field effect transistor (FET) that uses a semiconductor substrate such as a Si substrate, an SOI substrate or the like as a channel portion, or an organic TFT.

The antenna 21 is formed of a conductive material such as an element selected from aluminum (Al), titanium (Ti), silver (Ag), and copper (Cu), and an alloy material or a compound material that mainly contains these elements. The antenna 21 may be formed over the same substrate as the element forming layer 22, or may be formed separately from the element forming layer 22 and then attached to the element forming layer 22 to be electrically connected thereto.

The structure of the element forming layer 22 in the semiconductor device is more specifically described with reference to FIG. 1B.

The element forming layer 22 is connected to the antenna 21, and has a power supply wire 23, a ground wire 24, a power supply circuit 25, functional circuits 26 and 27, and the like. The ends of the antenna 21 are connected to the power supply circuit 25 and the ground wire 24. A magnetic field passing through the antenna 21 is changed by electromagnetic waves emitted from a reader/writer and induced electromotive force is generated, thereby an AC voltage is supplied to the power supply circuit 25. The power supply circuit 25 rectifies and smoothes an AC voltage supplied from the antenna 21 to generate a power supply voltage. Since the power supply wire 23 is connected to the power supply circuit 25, a power supply voltage is supplied from the power supply circuit 25 to the power supply wire 23. The functional circuits 26 and 27 are connected to the power supply wire 23 and the ground wire 24, and operated when a power supply voltage is supplied thereto from the power supply wire 23 and the ground wire 24. Note that the functional circuits include a clock generation circuit, a data demodulation/modulation circuit, a control circuit for controlling various circuits, a memory circuit and the like.

Figure 4A:
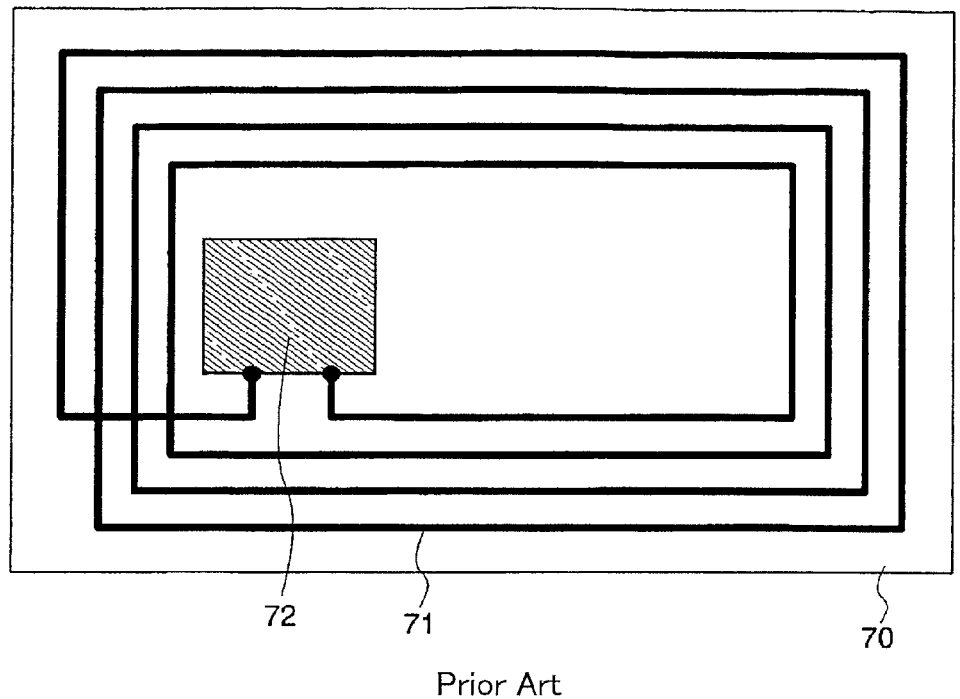
FIGS. 4A and 4B are diagrams each showing a configuration example of a conventional semiconductor device.
Figure 4B:
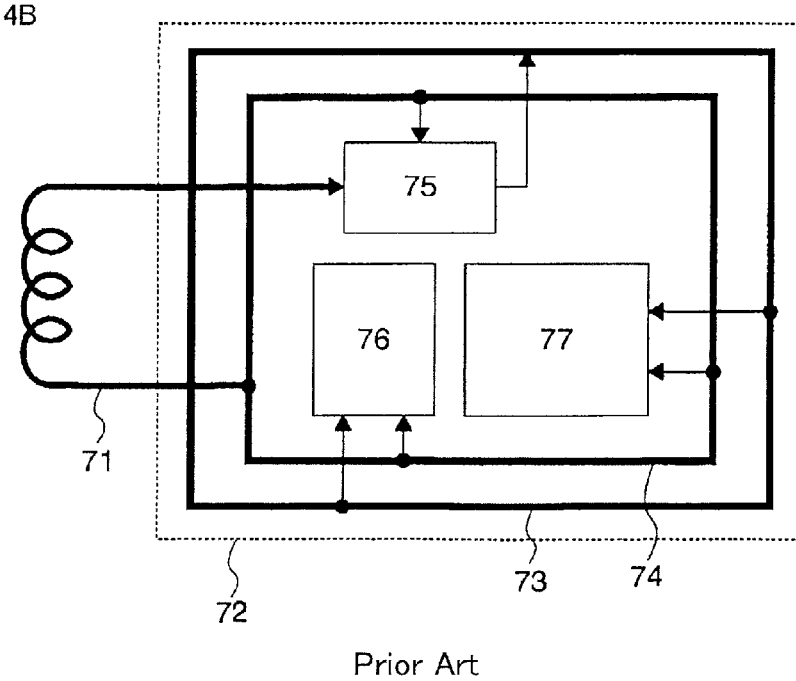
Figure 5A:
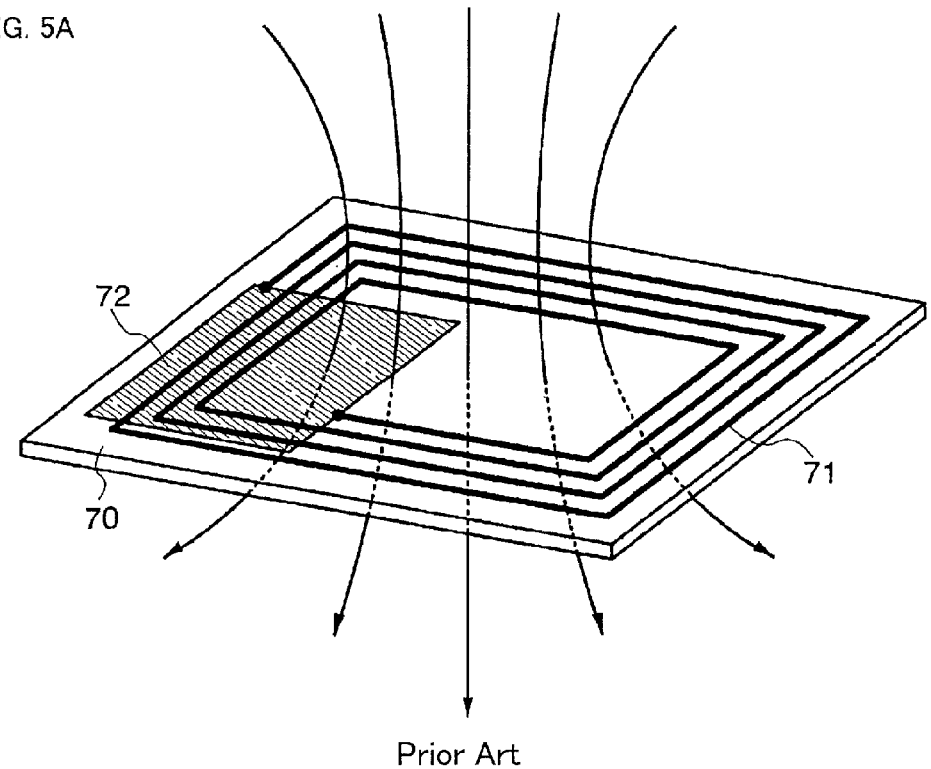
FIGS. 5A and 5B are diagrams each showing a configuration example of a conventional semiconductor device.
Figure 5B:
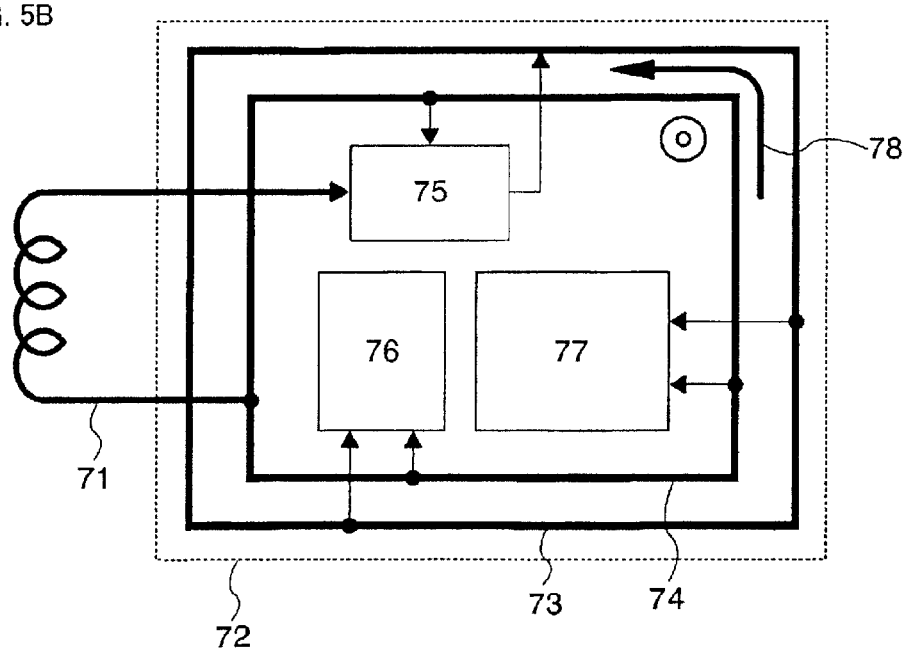

In this embodiment mode, the power supply wire 23 and the ground wire 24 are arranged in a non-circular shape. That is to say, the wires are arranged in a different manner than conventional power supply wire, ground wire and the like (see FIG. 4B) that are arranged in a circular shape so as to surround functional circuits and the like. For example, as shown in FIG. 1B, the power supply wire 23 and the ground wire 24 may be arranged in a U-shape instead of being arranged so as to surround the functional circuits and the like, so that they are arranged in a non-circular shape.

Note that the circular shape herein includes not only a curved shape, but also an elliptic shape, a rectangular shape, a shape consisting of a wire whose terminals are connected to each other or a wire that surrounds an area once or more. That is to say, a wire arranged in a circular shape includes a wire arranged in a coil as well as a curved wire and a rectangular wire. In addition, the aforementioned shapes may be arranged in three dimensions. Shapes other than such a circular shape are referred to as non-circular shapes.

When the wires such as the power supply wire and the ground wire are thus arranged in a non-circular shape, it is possible to suppress a current generated in the wires such as the power supply wire and the ground wire due to a change in a magnetic field, and to prevent reduction in the amplitude of electromagnetic waves transmitted from a reader/writer. In addition, heating of the element forming layer due to the current can also be prevented.

[Embodiment Mode 2]

In this embodiment mode, a structure example of the semiconductor device, which is different from that shown in the aforementioned embodiment mode, is described with reference to drawings.

Described in the aforementioned embodiment mode is an example where wires such as a power supply wire and a ground wire, which are arranged in a circular shape so as to surround functional circuits and the like, are partially cut off to be formed into a U-shape. However, the invention is not limited to this, and wires such as a power supply wire and a ground wire may be arranged in any shape as long as it is not influenced by a change in a magnetic field. Specific examples different from that shown in the aforementioned embodiment mode are described below with reference to the drawings.

Figure 2A:
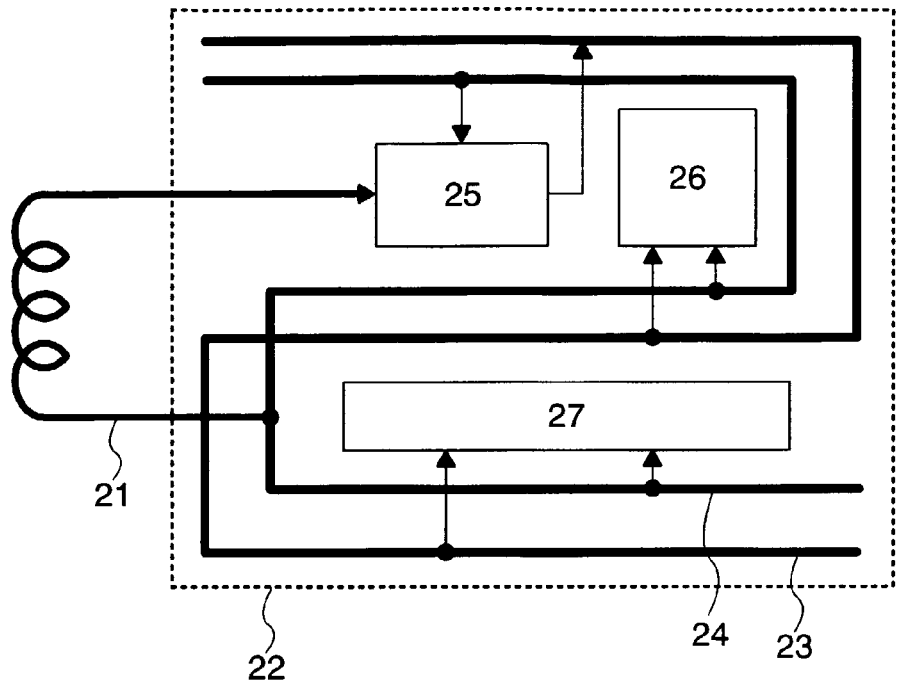
FIGS. 2A and 2B are diagrams each showing a configuration example of the semiconductor device of the invention.
Figure 2B:
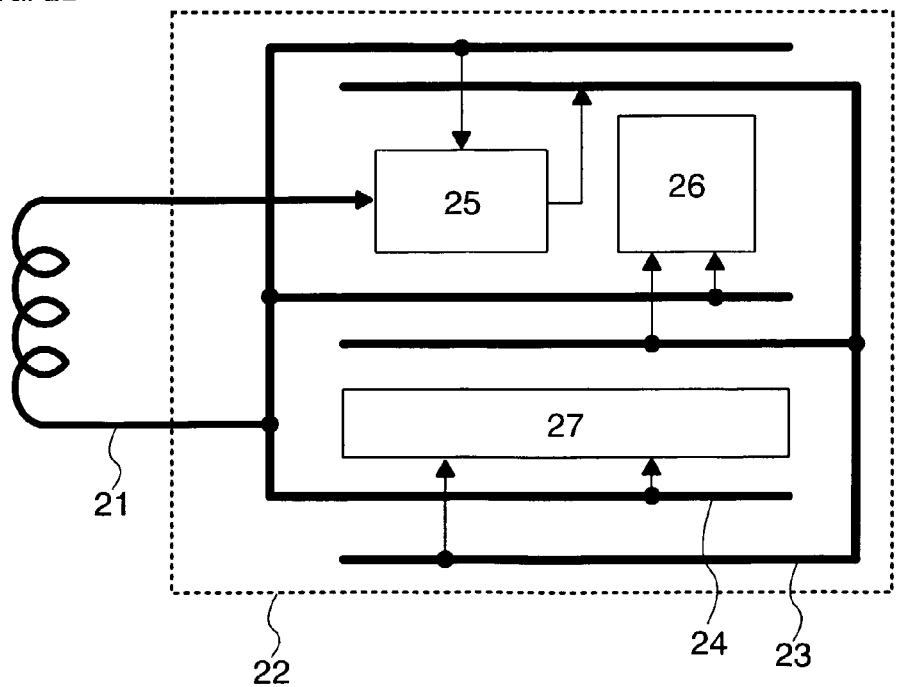

In FIGS. 2A and 2B, the power supply wire 23 and the ground wire 24 are provided so as to pass between the power supply circuit 25 and the functional circuits 26 and 27. In FIG. 2A, the power supply wire 23 and the ground wire 24 are not arranged in a circular shape, but bend left and right so as to surround the power supply circuit 25 and the functional circuits 26 and 27.

Alternatively, as shown in FIG. 2B, each of the power supply wire 23 and the ground wire 24 may be arranged in a comb shape and combined with each other. When the power supply wire 23 and the ground wire 24 are thus arranged in a comb shape, they can be provided at the periphery of the power supply circuit 25 and the functional circuits 26 and 27; therefore, an enough voltage can be supplied to the power supply circuit 25 and the functional circuits 26 and 27.

In this manner, when the power supply wire 23 and the ground wire 24 are arranged in a non-circular shape, a current can be prevented from being generated in the power supply wire 23, the ground wire 24 and the like due to a change in a magnetic field.

Figure 3:
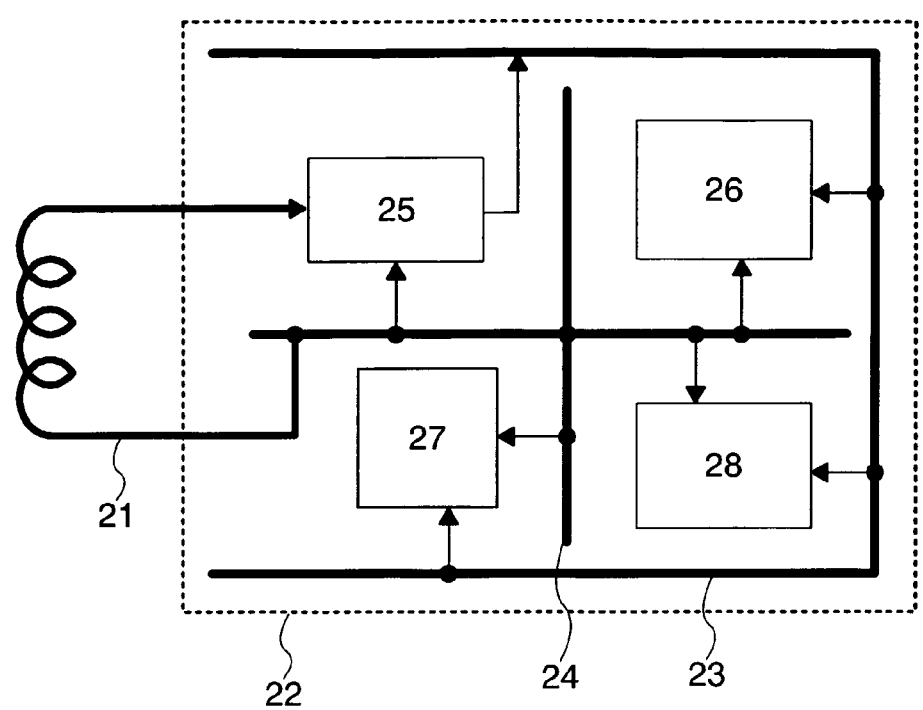
FIG. 3 is a diagram showing a configuration example of the semiconductor device of the invention.

The structure of the wires such as the power supply wire 23 and the ground wire 24 is not limited to those shown in FIGS. 2A and 2B. For example, as shown in FIG. 3, one or both of the power supply wire 23 and the ground wire 24 (here, the ground wire 24) may be arranged in a cross shape. Then, the power supply circuit 25 and functional circuits 26 to 28 may be provided at the periphery of the wire arranged in a cross shape.

Besides the shapes shown in this embodiment mode, the wires such as the power supply wire 23 and the ground wire 24 may be arranged in, for example, a zigzag shape, a V-shape, a swastika, or the like. In this manner, on the element forming layer 22, the wires such as the power supply wire 23 and the ground wire 24 may be formed in any shape other than the circular shape. The shape of the wires may be appropriately selected by a practitioner so as to supply an enough voltage to the power supply circuit, the functional circuits and the like.

When the wires such as the power supply wire and the ground wire are thus arranged in a non-circular shape, it is possible to suppress a current generated in the power supply wire, the ground wire and the like due to a change in a magnetic field, and to prevent reduction in the amplitude of electromagnetic waves transmitted from a reader/writer. In addition, heating of the element forming layer due to the current can also be prevented.

This embodiment mode can be implemented in combination with the aforementioned embodiment mode.

[Embodiment Mode 3]

In this embodiment mode, an example of manufacturing steps of the semiconductor device of the invention is described with reference to drawings. Specifically shown is an example of manufacturing a semiconductor device using a thin film transistor (TFT) as a transistor on an element forming layer by a separating method where a TFT is provided over a support substrate and then separated therefrom.

Figure 6A:
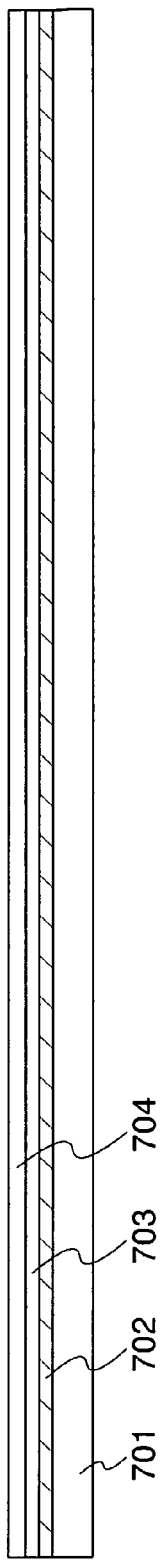
FIGS. 6A to 6C are diagrams each showing an example of manufacturing steps of the semiconductor device of the invention.

First, a separation layer 702 is formed over a surface of a substrate 701 (FIG. 6A). The substrate 701 may be a glass substrate, a quartz substrate, a metal substrate such as stainless having a surface over which an insulating film is formed, a plastic substrate having heat resistance to the processing temperature of the steps, or the like. Such a substrate 701 has no limit in terms of size and shape. Accordingly, for example, if a rectangular substrate with each side of one meter or more is used for the substrate 701, productivity can be dramatically increased. This is a major advantage as compared to the case of using a circular silicon substrate. Note that although the separation layer 702 is formed over the entire surface of the substrate 701 in this step, it may be selectively formed by photolithography after being formed over the entire surface of the substrate 701. In addition, the separation layer 702 is formed in contact with the substrate 701 in this step; however, if necessary, a base insulating film may be formed in contact with the substrate 701 and the separation layer 702 may be formed in contact with the base insulating film.

The separation layer 702 is formed of a metal film and an oxide film of the metal. In order to obtain the metal film, a single layer or stacked layers are formed by a known method (such as sputtering and plasma CVD) using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), and iridium (Ir), or an alloy material or a compound material mainly containing these elements. The metal oxide film is formed over the surface of the metal film by performing plasma treatment in an oxygen atmosphere to the metal film or performing heat treatment in an oxygen atmosphere to the metal film. Note that a metal oxynitride film may be used instead of the metal oxide film.

If the metal film has a single layer structure, for example, a tungsten layer, a molybdenum layer, or a layer containing a mixture of tungsten and molybdenum is formed. Then, a layer containing an oxide or an oxynitride of tungsten, a layer containing an oxide or an oxynitride of molybdenum, or a layer containing an oxide or an oxynitride of a mixture of tungsten and molybdenum is formed over the surface of the metal film. Note that the mixture of tungsten and molybdenum corresponds, for example, to an alloy of tungsten and molybdenum.

Alternatively, as the separation layer 702, after a metal film is formed over the substrate 701, a metal oxide film may be formed by sputtering in an oxygen atmosphere using the material of the metal film as a target. In that case, the metal film and the metal oxide film may be formed using different metal elements. Note that a metal oxide film may be formed directly over the substrate 701 to be used as the separation layer 702.

Subsequently, a base insulating film 703 is formed to cover the separation layer 702. In order to obtain the insulating film 703, a single layer or stacked layers are formed by a known method (such as sputtering and plasma CVD) using a film containing an oxide of silicon or a nitride of silicon. If the base insulating film 703 has a two-layer structure, for example, a silicon nitride oxide film and a silicon oxynitride film may be formed as the first layer and the second layer respectively. If the base insulating film 703 has a three-layer structure, a silicon oxide film, a silicon nitride oxide film, and a silicon oxynitride film may be formed as the first to third layers respectively. Instead, a silicon oxynitride film, a silicon nitride oxide film, and a silicon oxynitride film may be formed as the first to third layers respectively. The base insulating film 703 functions as a blocking film for preventing entering of impurities from substrate 701.

Figure 6B:
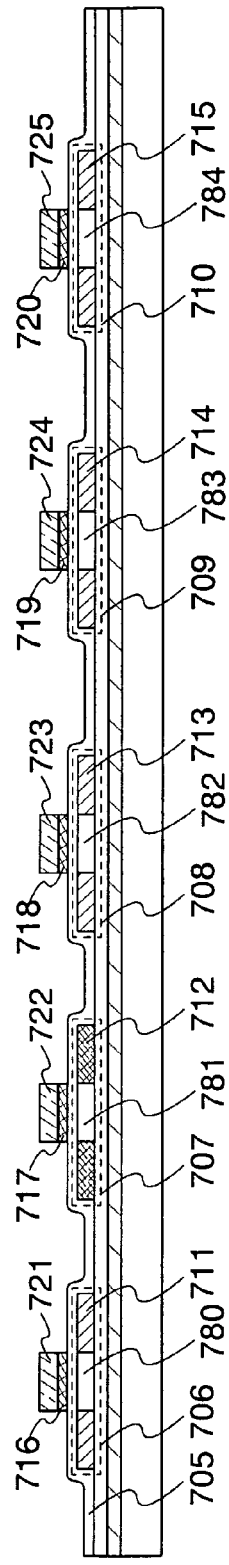

An amorphous semiconductor film 704 (e.g., a film containing amorphous silicon) is formed over the insulating film 703. The amorphous semiconductor film 704 is formed by a known method (such as sputtering, LPCVD, and plasma CVD) to have a thickness of 25 to 200 nm (preferably, 30 to 150 nm). Then, the amorphous semiconductor film 704 is crystallized by a known crystallizing method (such as laser crystallization, thermal crystallization using RTA or an annealing furnace, thermal crystallization using a metal element that accelerates crystallization, and a method combining laser crystallization and thermal crystallization using a metal element that accelerates crystallization), so that a crystalline semiconductor film is formed. Then, the obtained crystalline semiconductor film is etched to a desired shape, thereby forming crystalline semiconductor films 706 to 710 (FIG. 6B). Note that the separation layer 702, the insulating film 703 and the amorphous semiconductor film 704 may be formed continuously.

An example of manufacturing steps of the crystalline semiconductor films 706 to 710 is briefly described below. First, an amorphous semiconductor film with a thickness of 66 nm is formed by plasma CVD. After the amorphous semiconductor film is coated with a solution containing nickel that is a metal element for accelerating crystallization, the amorphous semiconductor film is subjected to dehydrogenation treatment (at 500° C. for one hour) and thermal crystallization treatment (at 550° C. for four hours), thereby forming a crystalline semiconductor film. Then, the crystalline semiconductor film may be irradiated with laser light as needed, and the crystalline semiconductor films 706 to 710 are formed by photolithography.

If the crystalline semiconductor films 706 to 710 are formed by laser crystallization, a continuous wave solid-state or gas laser or a pulsed solid-state or gas laser is employed. As a gas laser, an excimer laser, a YAG laser, a YVO$_4$ laser, a YLF laser, a YAlO$_3$ laser, a glass laser, a ruby laser, a Ti sapphire laser, or the like may be used. As a solid-state laser, a laser using crystals such as YAQ YVO$_4$, YLF, and YAlO$_3$ doped with Cr, Nd, Er, Ho, Ce, Co, Ti, or Tm may be used. In particular, when a fundamental wave of a continuous wave laser or second to fourth harmonics of the fundamental wave are used, crystals with a large grain size can be obtained. For example, it is possible to use the second harmonic (532 nm) or the third harmonic (355 nm) of an Nd:YVO$_4$ laser (fundamental wave: 1064 nm). Note that a continuous wave laser beam of a fundamental wave and a continuous wave laser beam of a harmonic may be irradiated, or a continuous wave laser beam of a fundamental wave and a pulsed laser beam of a harmonic may also be irradiated. A plurality of laser beams can compensate energy. When adopting a pulsed laser operating at such a repetition rate that a semiconductor film melted by a laser beam is irradiated with the next pulsed laser beam before being solidified, crystal grains that are continuously grown in the scan direction can be obtained. That is to say, it is possible to use a pulsed laser having a minimum repetition rate that is set to be smaller than the time required for a semiconductor film melted by the preceding beam to be solidified. More specifically, a laser beam operating at a repetition rate of 10 MHz or more may be used.

When the amorphous semiconductor film is crystallized using a metal element that accelerates crystallization, crystallization can be performed at a low temperature in a short time and crystals can be aligned in the same direction. On the other hand, off-current increases since the metal element remains on the crystalline semiconductor films, leading to variations in characteristics. Therefore, an amorphous semiconductor film functioning as a gettering site is preferably formed over the crystalline semiconductor films. The amorphous semiconductor film functioning as a gettering site is required to contain an impurity element such as phosphorus and argon; therefore, it is preferably formed by sputtering so as to contain argon at a high concentration. Then, a metal element is diffused in the amorphous semiconductor film by heat treatment (such as thermal annealing using RTA or an annealing furnace), and the amorphous semiconductor film containing the metal element is removed. As a result, the metal element in the crystalline semiconductor films can be reduced or removed.

Subsequently, a gate insulating film 705 is formed to cover the crystalline semiconductor films 706 to 710. In order to obtain the gate insulating film 705, a single layer or stacked layers are formed by a known method (such as plasma CVD and sputtering) using a film containing an oxide of silicon or a nitride of silicon. Specifically, a single layer or stacked layers are formed using a film containing silicon oxide, a film containing silicon oxynitride, or a film containing silicon nitride oxide.

A first conductive film and a second conductive film are formed over the gate insulating film 705. The first conductive film is formed by a known method (such as plasma CVD and sputtering) to have a thickness of 20 to 100 nm. The second conductive film is formed by a known method to have a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), and niobium (Nd), or an alloy material or a compound material that mainly contains these elements. Instead, the first conductive film and the second conductive film are formed of a semiconductor material typified by polycrystalline silicon doped with an impurity element such as phosphorus. The first conductive film and the second conductive film may be formed of, for example, a tantalum nitride (TaN) film and a tungsten (W) film, a tungsten nitride (WN) film and a tungsten film, a molybdenum nitride (MoN) film and a molybdenum (Mo) film, or the like. If the first conductive film and the second conductive film are formed of tungsten or tantalum nitride that has high heat resistance, they may be subjected to heat treatment for thermal activation. If a three-layer structure is adopted instead of the two-layer structure, a molybdenum film, an aluminum film and a molybdenum film may be stacked.

A resist mask is formed by photolithography, and conductive films (also referred to as gate electrodes) 716 to 725 functioning as gate electrodes are formed by etching for forming gate electrodes and gate wires. Wires such as a power supply wire and a ground wire may be formed over the same layer as the conductive films 716 to 725. In that case, the wires may be formed simultaneously with and using the same material as the conductive films 716 to 725. Note that the wires such as a power supply wire and a ground wire are arranged in a non-circular shape as described in the aforementioned embodiment modes.

A resist mask is formed by photolithography, and a low concentration of an impurity element that imparts N-type conductivity is added to the crystalline semiconductor films 706 and 708 to 710 by ion doping or ion implantation, thereby forming N-type impurity regions 711 and 713 to 715 and channel forming regions 780 and 782 to 784. The impurity element that imparts N-type conductivity may be an element belonging to group 15 of the periodic table, and for example, phosphorus (P) or arsenic (As) may be used.

A resist mask is formed by photolithography, and an impurity element that imparts P-type conductivity is added to the crystalline semiconductor film 707, thereby forming a P-type impurity region 712 and a channel forming region 781. As the impurity element that imparts P-type conductivity, for example, boron (B) is used.

Figure 6C:
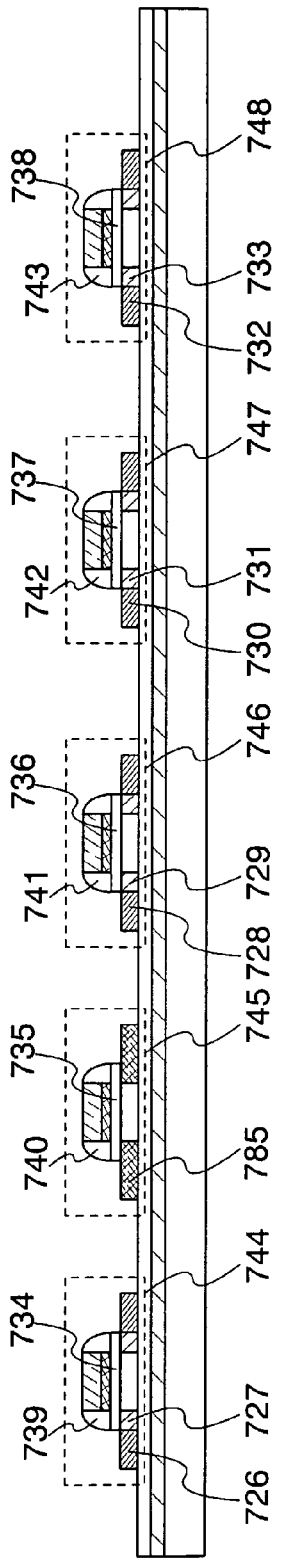

An insulating film is formed to cover the gate insulating film 705 and the conductive films 716 to 725. In order to obtain the insulating film, a single layer or stacked layers are formed by a known method (such as plasma CVD and sputtering) using a film containing an inorganic material such as silicon, an oxide of silicon and a nitride of silicon, or a film containing an organic material such as an organic resin. Then, the insulating film is selectively etched by anisotropic etching that is mainly in the direction perpendicular to the surface of the substrate, so that insulating films (also referred to as sidewalls) 739 to 743 are formed in contact with the sides of the conductive films 716 to 725 (FIG. 6C). While forming the insulating films 739 to 743, insulating films 734 to 738 are formed by etching the insulating film 705. The insulating films 739 to 743 are used as masks in a subsequent doping step for forming LDD (Lightly Doped Drain) regions.

An impurity element that imparts N-type conductivity is added to the crystalline semiconductor films 706 and 708 to 710 using as masks a resist mask formed by photolithography and the insulating films 739 to 743, thereby forming first N-type impurity regions (also referred to as LDD regions) 727, 729, 731, and 733 and second N-type impurity regions 726, 728, 730, and 732. The concentration of the impurity element contained in the first N-type impurity regions 727, 729, 731, and 733 is lower than that in the second N-type impurity regions 726, 728, 730, and 732. Through the aforementioned steps, N-type thin film transistors 744 and 746 to 748 and a P-type thin film transistor 745 are completed.

An LDD region is formed by either of the following two methods: a gate electrode having a two or more layer structure is etched so as to have a tapered shape or anisotropically etched and a lower layer conductive film of the gate electrode is used as a mask; or a sidewall insulating film is used as a mask. A thin film transistor that is formed by employing the former method has a structure where an LDD region overlaps a gate electrode with a gate insulating film interposed therebetween. Since the gate electrode is etched so as to have a tapered shape or anisotropically etched in such a structure, the width of the LDD region cannot be controlled easily, and the LDD region cannot be formed in some cases if the etching step is not performed properly. Meanwhile, when adopting the latter method where a sidewall insulating film is used as a mask, the width of the LDD region is controlled easily as compared to the case of adopting the former method and the LDD region is surely formed.

Figure 7A:
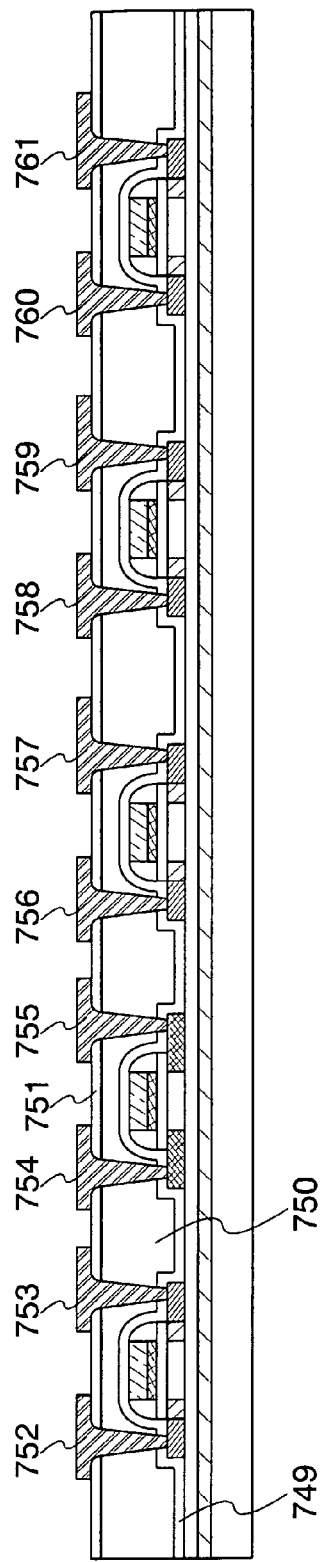
FIGS. 7A and 7B are diagrams each showing an example of manufacturing steps of the semiconductor device of the invention.

Subsequently, an insulating film is formed of a single layer or stacked layers to cover the thin film transistors 744 to 748 (FIG. 7A). In order to obtain the insulating film covering the thin film transistors 744 to 748, a single layer or stacked layers are formed by a known method (such as SOG and droplet discharging) using an inorganic material such as an oxide of silicon and a nitride of silicon, an organic material such as polyimide, polyamide, benzocyclobutene, acrylic, epoxy, and siloxane, or the like. A siloxane-based material is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. If the insulating film covering the thin film transistors 744 to 748 has, for example, a three-layer structure, a silicon oxide film may be formed as a first layer insulating film 749, a resin film may be formed as a second layer insulating film 750, and a silicon nitride film may be formed as a third layer insulating film 751.

Before forming the insulating films 749 to 751 or after forming one or more of the insulating films 749 to 751, heat treatment may be performed for recovery of the crystallinity of the semiconductor films, activation of the impurity elements added to the semiconductor films, and hydrogenation of the semiconductor films. As the heat treatment, thermal anneal, laser anneal, RTA or the like may be adopted.

Next, the insulating films 749 to 751 are etched by photolithography, thereby forming contact holes to expose the N-type impurity regions 726, 728, 730, and 732 the P-type impurity region 785. Then, conductive films are formed to fill in the contact holes, and patterned to form conductive films 752 to 761 functioning as source and drain wires. At this time, wires such as a power supply wire and a ground wire may be formed over the same layer as the conductive films 752 to 761 functioning as the source and drain wires. In that case, the wires may be formed simultaneously with and using the same material as the conductive films 752 to 761. Note that the wires such as a power supply wire and a ground wire are arranged in a non-circular shape as described in the aforementioned embodiment modes.

In order to obtain the conductive films 752 to 761, a single layer or stacked layers are formed by a known method (such as plasma CVD and sputtering) using an element selected from titanium (Ti), aluminum (Al) and neodymium (Nd), or an alloy material or a compound material mainly containing such elements. The alloy material mainly containing aluminum corresponds, for example, to a material that mainly contains aluminum and contains nickel, or an alloy material that mainly contains aluminum and contains nickel and one or both of carbon and silicon. The conductive films 752 to 761 may adopt, for example, a stacked layer structure of a barrier film, an aluminum-silicon (Al—Si) film and a barrier film, or a stacked layer structure of a barrier film, an aluminum-silicon (Al—Si) film, a titanium nitride (TiN) film, and a barrier film. Note that the barrier film corresponds to a thin film made of titanium, a nitride of titanium, molybdenum, or a nitride or molybdenum. Aluminum and aluminum silicon are suitable for the material of the conductive films 752 to 761 since they have a low resistance value and are inexpensive. If barrier layers are provided as the top and bottom layers, hillock generation of aluminum or aluminum silicon can be prevented. In addition, if the barrier film is formed of titanium that has high reducing ability, a thin natural oxide film which may possibly be formed over the crystalline semiconductor films can be reduced and thus a favorable contact can be obtained between the barrier film and the crystalline semiconductor films.

Figure 7B:
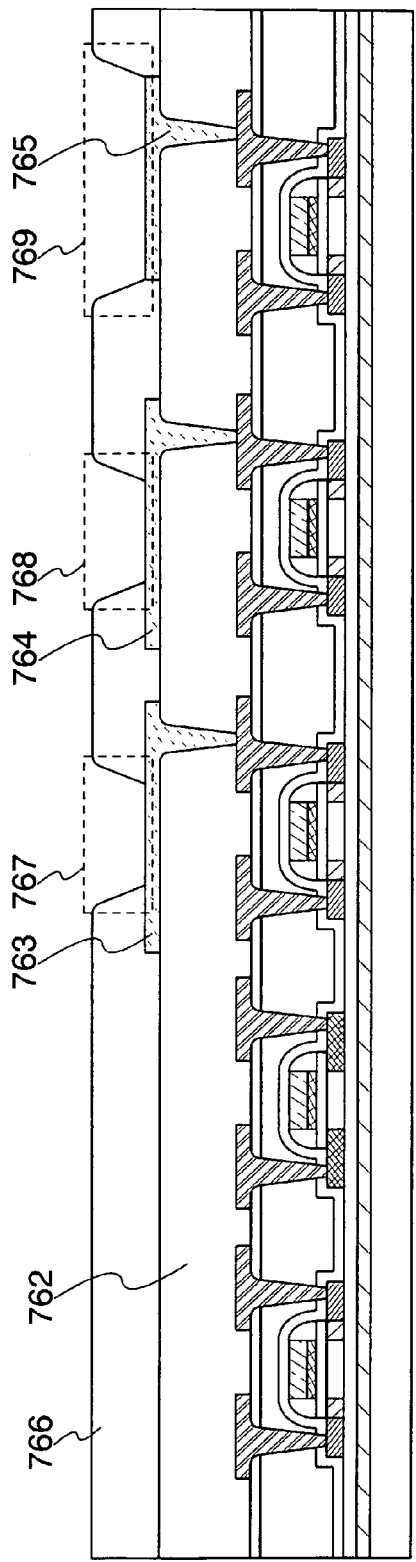

Subsequently, an insulating film 762 is formed to cover the conductive films 752 to 761 (FIG. 7B). In order to obtain the insulating film 762, a single layer or stacked layers are formed by a known method (such as SOG and droplet discharging) using an inorganic material or an organic material. The insulating film 762 is preferably formed to have a thickness of 0.75 to 3 µm.

The insulating film 762 is etched by photolithography, thereby forming contact holes to expose the conductive films 757, 759 and 761. Then, conductive films are formed to fill in the contact holes. The conductive films are formed by a known method (such as plasma CVD and sputtering) using a conductive material. Subsequently, the conductive films are patterned to form conductive films 763 to 765. Note that the conductive films 763 to 765 correspond to one of a pair of conductive films included in a memory element. Accordingly, it is preferable that the conductive films 763 to 765 be formed of a single layer or stacked layers using titanium, or an alloy material or a compound material that mainly contains titanium. Since titanium has a low resistance value, the size of the memory element can be reduced, leading to high integration. In addition, in a photolithography step for forming the conductive films 763 to 765, wet etching is preferably performed in order not to damage the thin film transistors 744 to 748 on the bottom layer, and hydrogen fluoride (HF) or ammonia peroxide mixture may be used as an etchant. Note that wires such as a power supply wire and a ground wire may be formed over the same layer as the conductive films 763 to 765. In that case, the wires may be formed simultaneously with and using the same material as the conductive films 763 to 765. The wires such as a power supply wire and a ground wire are arranged in a non-circular shape as described in the aforementioned embodiment modes.

An insulating film 766 is formed to cover the conductive films 763 to 765. In order to obtain the insulating film 766, a single layer or stacked layers are formed by a known method (such as SOG and droplet discharging) using an inorganic material or an organic material. The insulating film 766 preferably has a thickness of 0.75 to 3 µm. Then, the insulating film 766 is etched by photolithography, thereby forming contact holes 767 to 769 to expose the conductive films 763 to 765.

A conductive film 786 functioning as an antenna is formed in contact with the conductive film 765 (FIG. 8A). The conductive film 786 is formed by a known method (such as plasma CVD, sputtering, printing, and droplet discharging) using a conductive material. The conductive film 786 is preferably formed of a single layer or stacked layers using an element selected from aluminum (Al), titanium (Ti), silver (Ag), and copper (Cu), or an alloy material or a compound material that mainly contains these elements. In this embodiment mode, the conductive film 786 is formed by screen printing using a paste containing silver and then applying heat treatment at a temperature of 50 to 350° C. Alternatively, the conductive film 786 may be obtained by forming an aluminum film by sputtering and then patterning the aluminum film. The aluminum film is preferably patterned by wet etching, and then subjected to heat treatment at a temperature of 200 to 300° C. Note that wires such as a power supply wire and a ground wire may be formed over the same layer as the conductive film 786. In that case, the wires may be formed simultaneously with and using the same material as the conductive film 786. The wires such as a power supply wire and a ground wire are arranged in a non-circular shape as described in the aforementioned embodiment modes.

Subsequently, an organic compound layer 787 is formed in contact with the conductive films 763 and 764 (FIG. 8B). The organic compound layer 787 is formed by a known method (such as droplet discharging and vapor deposition). Then, a conductive film 771 is formed in contact with the organic compound layer 787. The conductive film 771 is formed by a known method (such as sputtering and vapor deposition).

Wires such as a power supply wire and a ground wire may be formed simultaneously with the conductive film 771. The wires such as a power supply wire and a ground wire are arranged in a non-circular shape as described in the aforementioned embodiment modes. In this manner, the wires such as a power supply wire and a ground wire may be formed anywhere such as over the same layer as the conductive films 716 to 725, the conductive films 752 to 761, the conductive films 763 to 765, the conductive film 786, or the conductive film 771. The layer over which the wires are provided may be arbitrarily selected by a practitioner. In addition, a power supply wire and a ground wire may be formed over different layers. If an element forming layer has a multilayer structure and a power supply wire and a ground wire are provided above a thin film transistor, miniaturization of the element forming layer can be achieved.

Through the aforementioned steps, a memory element portion 789 formed by stacking the conductive film 763, the organic compound layer 787 and the conductive film 771, and a memory element portion 790 formed by stacking the conductive film 764, the organic compound layer 787 and the conductive film 771 are completed.

In the aforementioned manufacturing steps, since the organic compound layer 787 does not have high heat resistance, the step of forming the organic compound layer 787 is performed after the step of forming the conductive film 786 functioning as an antenna. The conductive film 786 functioning as an antenna may be formed over the same layer as the conductive films 716 to 725, the conductive films 752 to 761, the conductive films 763 to 765, or the conductive film 771. In order to obtain an antenna, a conductive film that is formed over another substrate may be attached to the conductive film 765 with an adhesive containing conductive particles and the like instead of directly forming the conductive film 786 functioning as an antenna. In that case, an antenna can be formed even after providing the organic compound layer 787.

Although an organic compound material is used for the memory element portions 789 and 790 in this embodiment mode, the invention is not limited to this. It is possible to use, for example, a phase change material such as a material that reversibly changes between a crystalline state and an amorphous state and a material that reversibly changes between a first crystalline state and a second crystalline state. Instead, a material that changes only from an amorphous state to a crystalline state may also be used.

A material that reversibly changes between a crystalline state and an amorphous state is a material containing a plurality of elements selected from germanium (Ge), tellurium (Te), antimony (Sb), sulfur (S), tellurium oxide (TeOx), tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. A material that reversibly changes between a first crystalline state and a second crystalline state is a material containing a plurality of elements selected from silver (Ag), zinc (Zn), copper (Cu), aluminum (Al), nickel (Ni), indium (In), antimony (Sb), selenium (Se), and tellurium (Te), and for example, Te—TeO$_2$, Te—TeO$_2$—Pd, or Sb$_2$Se$_3$/Bi$_2$Te$_3$ may be used. When using such a material, a phase change is carried out between two different crystalline states. A material that changes only from an amorphous state to a crystalline state is a material containing a plurality of elements selected from tellurium (Te), tellurium oxide (TeOx), antimony (Sb), selenium (Se), and bismuth (Bi), and for example, Ag—Zn, Cu—Al—Ni, In—Sb, In—Sb—Se, or In—Sb—Te may be used.

Subsequently, an insulating film 772 functioning as a protective film is formed by a known method (such as SOG and droplet discharging) to cover the memory element portions 789 and 790 and the conductive film 786 functioning as an antenna. The insulating film 772 is formed of carbon such as DLC (Diamond Like Carbon), silicon nitride, silicon nitride oxide, or an organic material, and preferably formed of an epoxy resin.

Figures 9A, 9B:
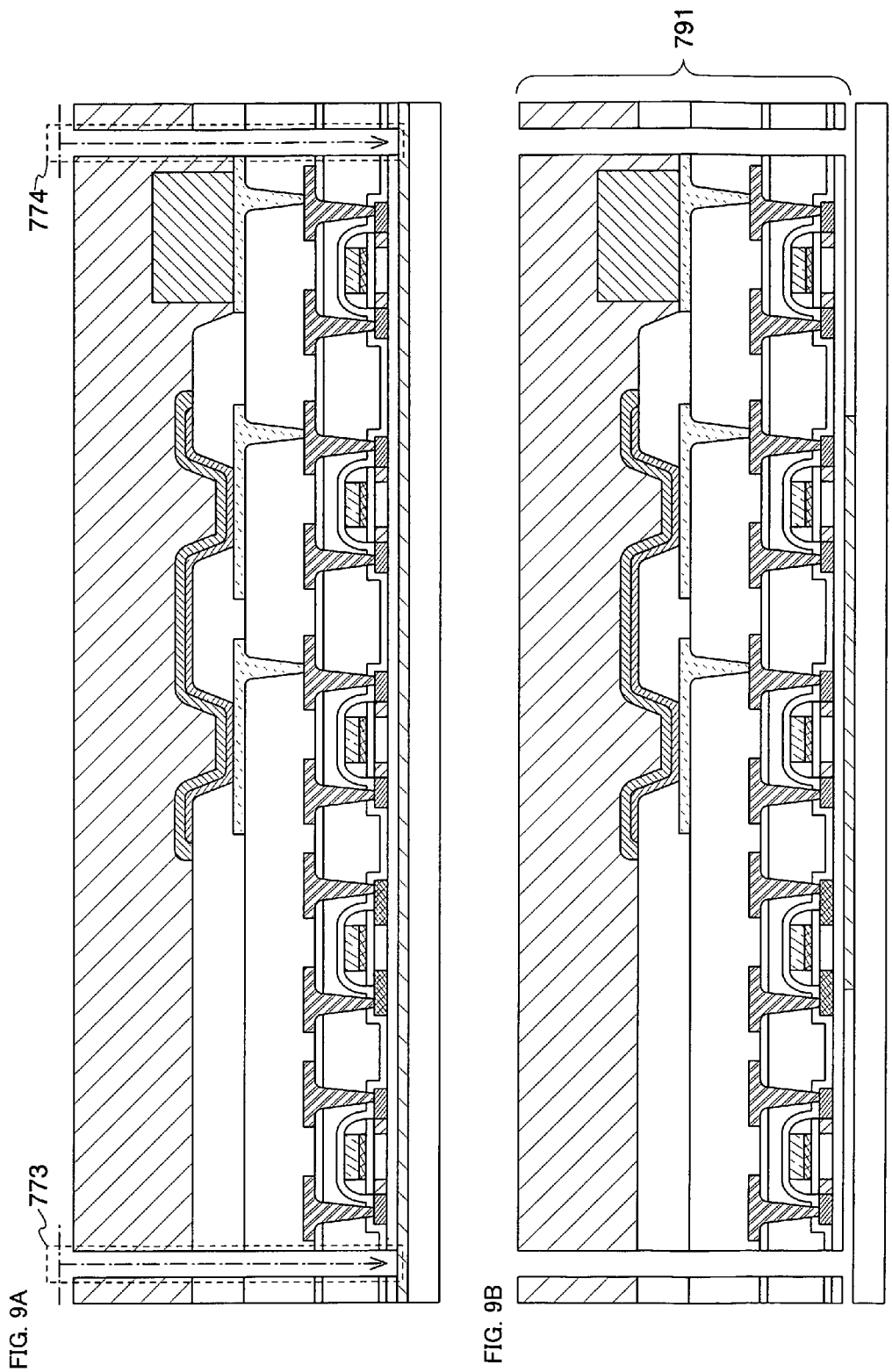
FIGS. 9A and 9B are diagrams each showing an example of manufacturing steps of the semiconductor device of the invention.

Then, an element forming layer 791 having the thin film transistors 744 to 748, the memory element portions 789 and 790, and the like is separated from the substrate 701. In this embodiment mode, after openings 773 and 774 are formed by irradiation with laser light (e.g., UV light) (FIG. 9A), the element forming layer 791 can be separated from the substrate 701 by physical force. Alternatively, an etchant may be put in the openings 773 and 774 before separating the element forming layer 791 from the substrate 701, thereby removing the separation layer 702. A gas or liquid containing halogen fluoride or an inter-halogen compound is used as the etchant. For example, chlorine trifluoride ($ClF_3$) is used as a gas containing halogen fluoride. Thus, the element forming layer 791 is separated from the substrate 701. Note that the separation layer 702 is not necessarily entirely removed and may partially remain. According to this, the consumption of the etchant can be suppressed and processing time required for removing the separation layer 702 can be reduced.

The substrate 701 separated from the element forming layer 791 is preferably reused for cost reduction. The insulating film 772 is formed to prevent the element forming layer 791 from scattering after the separation layer 702 is removed. Since the element forming layer 791 is small, thin and lightweight, it easily scatters as it is not tightly attached to the substrate 701 after the separation layer 702 is removed. However, by forming the insulating film 772 over the element forming layer 791, the weight of the element forming layer 791 can be increased and thus the scattering of the element forming layer 791 from the substrate 701 can be prevented. The element forming layer 791 itself is thin and lightweight; however, by forming the insulating layer 772, the element forming layer 791 separated from the substrate 701 is not yielded by pressure or the like, and can have a certain degree of strength.

Next, one surface of the element forming layer 791 is attached to a first sheet material 775 and completely separated from the substrate 701 (FIG. 10A). If the separation layer 702 is not entirely removed and partially remains, the element forming layer 791 is separated from the substrate 701 physically. Then, a second sheet material 776 is provided over the other surface of the element forming layer 791, and attached by applying one or both of heat treatment and pressure treatment. Simultaneously with or after the formation of the second sheet material 776, the first sheet material 775 is separated and a third sheet material 777 is provided instead. Then, the third sheet material 777 is attached by applying one or both of heat treatment and pressure treatment. As a result, a semiconductor device sealed with the second sheet material 776 and the third sheet material 777 is completed (FIG. 10B).

Note that the element forming layer 791 may be sealed with the first sheet material 775 and the second sheet material 776. However, if different sheet materials are used for a sheet material for separating the element forming layer 791 from the substrate 701 and a sheet material for sealing the element forming layer 791, the element forming layer 791 is sealed with the second sheet material 776 and the third sheet material 777 as described above. This is useful in separating the element forming layer 791 from the substrate 701, for example, when a sheet material with low adhesion is required to be used such as when the first sheet material 775 may be attached not only to the element forming layer 791 but also to the substrate 701.

As the second sheet material 776 and the third sheet material 777 used for sealing, a film made of polypropylene, polyester, vinyl, polyvinyl fluoride, polyvinyl chloride or the like, paper of a fibrous material, a stacked film of a base film (polyester, polyamide, an inorganic vapor deposited film, paper, or the like) and an adhesive synthetic resin film (an acrylic-based synthetic resin, an epoxy-based synthetic resin, or the like), and the like may be employed. The film may be obtained by performing heat treatment and pressure treatment to the subject by thermocompression bonding. In performing the heat treatment and the pressure treatment, an adhesive layer provided on the outermost surface of the film, or a layer (not an adhesive layer) that is provided on the outermost surface of the film and melted by heat treatment is attached by applying pressure. Adhesive layers may be provided over the surface of the second sheet material 776 and the third sheet material 777, or not. The adhesive layers correspond to a layer containing an adhesive such as a heat curing resin, an ultraviolet curing resin, an epoxy resin adhesive, and a resin additive. Silica coat is preferably used for a sheet material in order to prevent moisture from entering after the sealing, and it is possible to use, for example, a sheet material where an adhesive layer, a film such as polyester, and silica coat are stacked.

As the second sheet material 776 and the third sheet material 777, a film subjected to antistatic treatment for preventing static electricity (hereinafter referred to as an antistatic film) may be used as well. An antistatic film includes a film where an antistatic material is dispersed in a resin, a film to which an antistatic material is attached, and the like. A film containing an antistatic material may be a film having one surface provided with an antistatic material, or a film having the both surfaces provided with an antistatic material. In a film having one surface provided with an antistatic material, a surface containing an antistatic material may be attached to the inside or outside of the film. Note that an antistatic material may be provided over the entire surface or a part of a film. An antistatic material herein includes metal, an oxide of indium and tin (ITO), and a surfactant such as a zwitterionic surfactant, a cationic surfactant, and a nonionic surfactant. Instead, a resin material containing crosslinking polymer having a carboxyl group and a quaternary ammonium base in a side chain may be used as an antistatic material. An antistatic film may be obtained by attaching, kneading, or applying these materials onto a film. When a semiconductor device is sealed with an antistatic film, the semiconductor element can be protected from external static electricity when being handled as a product.

This embodiment mode can be implemented in combination with any of the aforementioned embodiment modes.

[Embodiment Mode 4]

In this embodiment mode, an example of using the semiconductor device of the invention as an RFID tag capable of communicating data wirelessly is described with reference to FIGS. 11A to 11C.

Figure 11A:
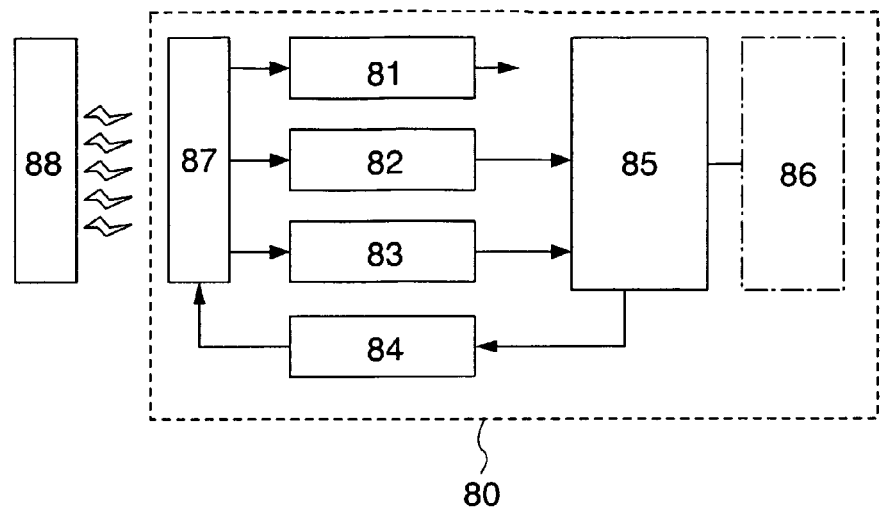
FIGS. 11A to 11C are diagrams each showing an application of the semiconductor device of the invention.
Figure 11B:
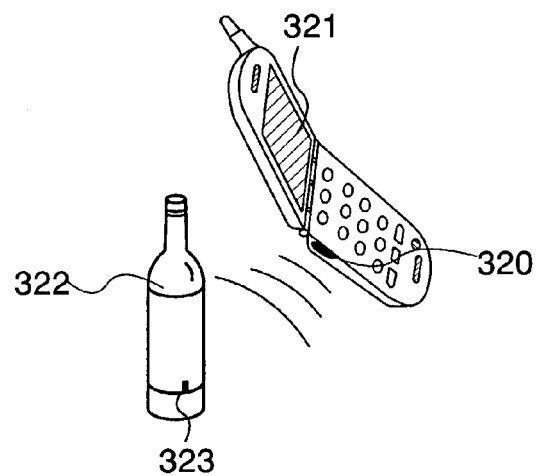
Figure 11C:
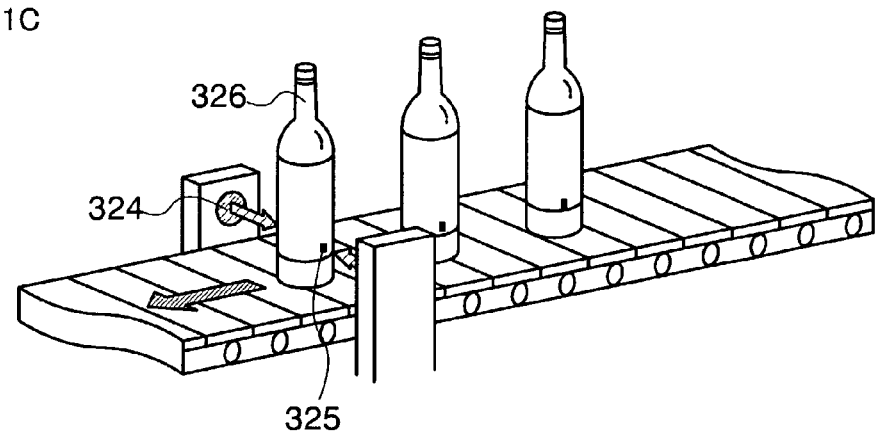

An RFID tag 80 has a function of communicating data wirelessly, and includes a power supply circuit 81, a clock generation circuit 82, a data demodulation circuit 83, a data modulation circuit 84, a control circuit 85 for controlling other circuits, a memory circuit 86, and an antenna 87 (FIG. 11A). Note that the memory circuit is not limited to one, and a plurality of memory circuits may be provided. As the memory circuit, an SRAM, a flash memory, a ROM, an FeRAM, or a memory having a memory element portion formed of the organic compound layer described in the aforementioned embodiment mode, may be used.

A signal transmitted as electromagnetic waves from a reader/writer 88 is converted into an AC electrical signal in an antenna 87 by electromagnetic induction. In the power supply circuit 81, a power supply voltage is generated using an AC electrical signal, and supplied to each circuit using a power supply wire. In the clock generation circuit 82, various clock signals are generated based on an AC signal inputted from the antenna 87, and supplied to the control circuit 85. In the data demodulation circuit 83, an AC electrical signal is demodulated and supplied to the control circuit 85. In the control circuit 85, various arithmetic operations are performed in accordance with the inputted signals. More specifically, the control circuit 85 has, for example, an instruction analyzing portion for decoding a signal that is demodulated by the data demodulation circuit 83, a CRC (Cyclic Redundancy Check) circuit for checking the decoded signal, a memory controller for controlling the memory circuit 86, and the like. The memory circuit 86 stores programs, data and the like that are used in the control circuit 85, and functions as a work area for arithmetic operations. Then, data is transmitted from the control circuit 85 to the data modulation circuit 84, and load modulation of the antenna 87 can be achieved by means of the data transmitted from the data modulation circuit 84. The reader/writer 88 receives load modulation of the antenna 87 as electromagnetic waves, thereby reading data.

In addition, wires such as a power supply wire and a ground wire are provided at the periphery of the aforementioned circuits, and arranged in a non-circular shape as described in the aforementioned embodiment modes. Note that the RFID tag is not limited to the configuration above, and may have a configuration where other elements such as a limiter circuit of a power supply voltage and hardware dedicated to encryption are additionally provided.

In the RFID tag, a power supply voltage may be supplied to each circuit by electromagnetic waves without mounting a battery, or a battery may be mounted so that a power supply voltage is supplied to each circuit by both electromagnetic waves and the battery.

The semiconductor device of the invention that is applied to an RFID tag or the like has the advantages that data is communicated wirelessly, a plurality of pieces of data can be read, data can be written, the tag can be formed into various shapes, and wide directivity and recognition range are achieved in accordance with a selected frequency. The RFID tag may be applied to an IC tag capable of identifying data on individuals and objects by wireless communication, a label attached to an object, a wristband used in events and amusement parks, and the like. The RFID tag may be changed in shape with a resin material, or attached directly to a metal that blocks wireless communication. Further, the RFID tag may be used for various systems such as payment systems and management systems for entering and leaving rooms.

Next, an example of the practical use of the semiconductor device as an RFID tag is described. A reader/writer 320 is provided on a side of a portable terminal having a display portion 321, and an RFID tag 323 is provided on a side of an object 322 (FIG. 11B). When the reader/writer 320 is brought close to the RFID tag 323 included in the object 322, data on the object 322 such as ingredients, place of origin, test result in each production step, history of the distribution process, and explanation of the object is displayed on the display portion 321. Besides, an object 326 can be inspected using a reader/writer 324 and an RFID tag 325 attached to the object 326 while the object 326 is carried on a conveyor belt (FIG. 11C). By thus applying the RFID tag to the system, data can be obtained easily and a high performance system with high added value can be achieved.

This embodiment mode can be implemented in combination with any of the aforementioned embodiment modes.

[Embodiment Mode 5]

The application range of the semiconductor device of the invention is so wide that it may be applied to any object in order that the history thereof is revealed wirelessly and utilized in production, management and the like. For example, the semiconductor device of the invention may be incorporated in bills, coins, securities, certificates, bearer bonds, containers for packages, books, recording media, personal belongings, vehicles, foods, clothes, healthcare items, livingware, medicals, and electronic apparatuses. Examples of these objects are described with reference to FIGS. 12A to 12H.

Figure 12A:
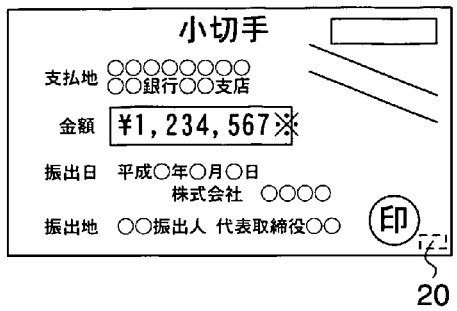
FIGS. 12A to 12H are diagrams each showing an application of the semiconductor device of the invention.
Figure 12B:
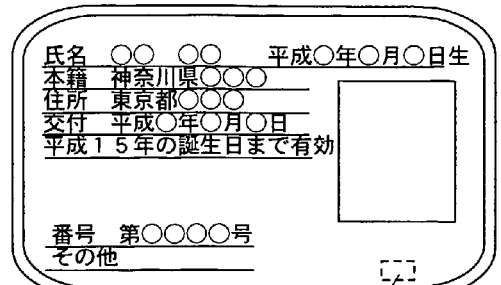
Figure 12C:
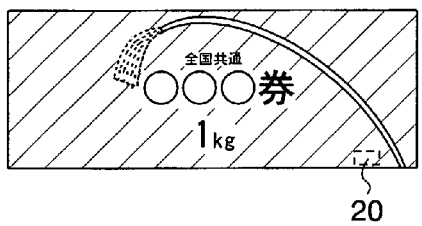
Figure 12D:
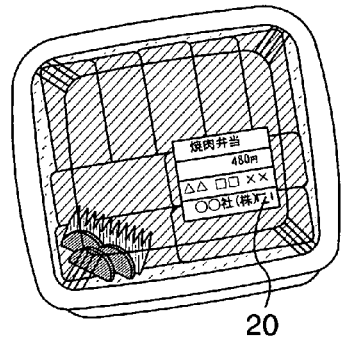
Figure 12E:
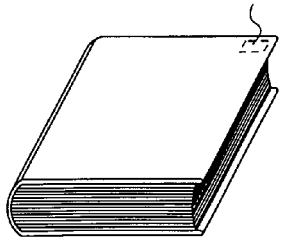
Figure 12F:
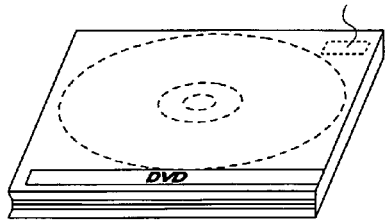
Figure 12G:
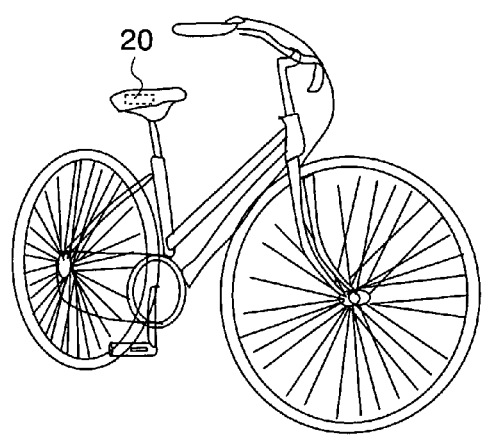
Figure 12H:
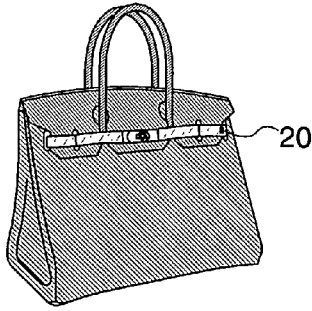

The bills and coins include currency in the market and include a note that is in currency in a specific area as money (cash voucher), memorial coins, and the like. The securities include a check, a certificate, a promissory note, and the like (FIG. 12A). The certificates include a driving license, a resident card, and the like (FIG. 12B). The bearer bonds include a stamp, a rice coupon, various gift coupons, and the like (FIG. 12C). The containers for packages include paper for packing a box lunch or the like, a plastic bottle, and the like (FIG. 12D). The books include a document and the like (FIG. 12E). The recording media include DVD software, a video tape, and the like (FIG. 12F). The vehicles include a wheeled vehicle such as a bicycle, a vessel, and the like (FIG. 12G). The personal belongings include a bag, glasses, and the like (FIG. 12H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic apparatuses include a liquid crystal display device, an EL display device, a television set (television receiver, thin television receiver), a mobile phone, and the like.

When an RFID tag is incorporated in bills, coins, securities, certificates, bearer bonds, and the like, forgery of them can be prevented. When an RFID tag is incorporated in containers for packages, books, recording media, personal belongings, foods, livingware, electronic apparatuses, and the like, inspection systems, rental systems and the like can be performed more efficiently. When an RFID tag is incorporated in vehicles, healthcare items, medicals, and the like, forgery and theft of them can be prevented and medicines can be prevented from being consumed in the wrong manner. An RFID tag may be attached to the surface of a product or incorporated into a product. For example, an RFID tag may be incorporated into the paper of a book, or an organic resin of a package. If data is written (rewritten) by an optical effect afterward, a transparent material is preferably used so that a memory element provided in a chip is irradiated with light. Further, forgery can be effectively prevented by using a memory element where data cannot be rewritten. Problems such as privacy after a user purchases a product can be solved by providing a system for erasing data of a memory element provided in an RFID tag.

In this manner, when an RFID tag is incorporated in containers for packages, recording media, personal belongings, foods, clothes, livingware, electronic apparatuses, and the like, inspection system, rental system and the like can be performed more efficiently. An RFID tag also prevents vehicles from being forged or stolen. In addition, when an RFID tag is implanted into creatures such as animals, each creature can be identified easily. For example, when an RFID tag is implanted into creatures such as domestic animals, not only the year of birth, sex, breed and the like but also the current body temperature can be easily controlled.

As set forth above, the semiconductor device of the invention can be incorporated in any object. This embodiment mode can be implemented in combination with any of the aforementioned embodiment modes.

EXPLANATION OF REFERENCE

20: substrate 21: antenna 22: element forming layer 23: power supply wire 24: ground wire 25: power supply circuit 26: functional circuit 27: functional circuit 28: functional circuit 70: substrate 71: antenna 72: element forming layer 73: power supply wire 74: ground wire. 75: power supply circuit 76: functional circuit 77: functional circuit 78: current 701: substrate 702: separation layer 703: insulating film 704: amorphous semiconductor film 705: insulating film 706: crystalline semiconductor film 707: crystalline semiconductor film 708: crystalline semiconductor film 709: crystalline semiconductor film 710: crystalline semiconductor film 711: N-type impurity region 712: P-type impurity region 713: N-type impurity region 714: N-type impurity region 715: N-type impurity region 716: conductive film 717: conductive film 718: conductive film 719: conductive film 720: conductive film 721: conductive film 722: conductive film 723: conductive film 724: conductive film 725: conductive film 726: N-type impurity region 727: N-type impurity region 728: N-type impurity region 729: N-type impurity region 730: N-type impurity region 731: N-type impurity region 732: N-type impurity region 733: N-type impurity region 734: insulating film 735: insulating film 736: insulating film 737: insulating film 738: insulating film 739: insulating film 740: insulating film 741: insulating film 742: insulating film 743: insulating film 744: thin film transistor 745: thin film transistor 746: thin film transistor 747: thin film transistor 748: thin film transistor 749: insulating film 750: insulating film 751: insulating film 752: conductive film 753: conductive film 754: conductive film 755: conductive film 756: conductive film 757: conductive film 758: conductive film 759: conductive film 760: conductive film 761: conductive film 762: insulating film 763: conductive film 764: conductive film 765: conductive film 766: insulating film 767: contact hole 768: contact hole 769: contact hole 771: conductive film 772: insulating film 773: opening 774: opening 780: channel forming region 781: channel forming region 782: channel forming region 783: channel forming region 784: channel forming region 785: P-type impurity region 786: conductive film 787: organic compound layer 789: memory element portion 790: memory element portion 791: element forming layer 775: first sheet material 776: second sheet material 777: third sheet material 80: RFID tag 81: power supply circuit 82: clock generation circuit 83: data demodulation circuit 84: data modulation circuit 85: control circuit 86: memory circuit 87: antenna 88: reader/writer 321: display portion 320: reader/writer 322: object 323: RFID tag 326: object 324: reader/writer 325: RFID tag.

The invention claimed is:

1. A semiconductor device comprising:
an element forming layer provided over a substrate, the element forming layer comprising an insulating layer, a first conductive layer, a second conductive layer, a power supply wire, and a ground wire;
a memory element electrically connected to the element forming layer, the memory element being in contact with the first conductive layer; and
an antenna electrically connected to the element forming layer, the antenna being in contact with the second conductive layer,
wherein the first conductive layer and the second conductive layer are provided over and in contact with the insulating layer,
wherein the substrate is selected from a glass substrate, a quartz substrate, a ceramic substrate, and a metal substrate,
wherein at least one of the power supply wire and the ground wire is arranged in a non-circular shape; and
wherein the element forming layer and the antenna are provided so as to overlap each other at least partially.

2. A semiconductor device comprising:
an element forming layer provided over a substrate, the element forming layer comprising an insulating layer, a first conductive layer, a second conductive layer, a power supply wire, and a ground wire;
a memory element electrically connected to the element forming layer, the memory element being in contact with the first conductive layer; and
an antenna electrically connected to the element forming layer, the antenna being in contact with the second conductive layer,
wherein the first conductive layer and the second conductive layer are provided over and in contact with the insulating layer,
wherein the substrate is selected from a glass substrate, a quartz substrate, a ceramic substrate, and a metal substrate,
wherein at least one of the power supply wire and the ground wire is arranged in a U-shape; and
wherein the element forming layer and the antenna are provided so as to overlap each other at least partially.

3. A semiconductor device comprising:
an element forming layer provided over a substrate, the element forming layer comprising an insulating layer, a first conductive layer, a second conductive layer, a power supply wire, and a ground wire;
a memory element electrically connected to the element forming layer, the memory element being in contact with the first conductive layer; and
an antenna electrically connected to the element forming layer, the antenna being in contact with the second conductive layer,
wherein the first conductive layer and the second conductive layer are provided over and in contact with the insulating layer,
wherein the substrate is selected from a glass substrate, a quartz substrate, a ceramic substrate, and a metal substrate,
wherein at least one of the power supply wire and the ground wire is arranged in a comb shape; and
wherein the element forming layer and the antenna are provided so as to overlap each other at least partially.

4. A semiconductor device comprising:
an element forming layer provided over a substrate, the element forming layer comprising an insulating layer, a first conductive layer, a second conductive layer, a power supply wire, and a ground wire;
a memory element electrically connected to the element forming layer, the memory element being in contact with the first conductive layer; and
an antenna electrically connected to the element forming layer, the antenna being in contact with the second conductive layer,
wherein the first conductive layer and the second conductive layer are provided over and in contact with the insulating layer,
wherein the substrate is selected from a glass substrate, a quartz substrate, a ceramic substrate, and a metal substrate,
wherein at least one of the power supply wire and the ground wire is arranged in a cross shape; and
wherein the element forming layer and the antenna are provided so as to overlap each other at least partially.

5. A semiconductor device comprising:
an element forming layer provided over a substrate, the element forming layer comprising an insulating layer, a first conductive layer, a second conductive layer, a power supply wire, and a ground wire;
a memory element electrically connected to the element forming layer, the memory element being in contact with the first conductive layer; and
an antenna electrically connected to the element forming layer, the antenna being in contact with the second conductive layer,
wherein the first conductive layer and the second conductive layer are provided over and in contact with the insulating layer,
wherein the substrate is selected from a glass substrate, a quartz substrate, a ceramic substrate, and a metal substrate,
wherein at least one of the power supply wire and the ground wire is arranged in a zigzag shape; and
wherein the element forming layer and the antenna are provided so as to overlap each other at least partially.

6. The semiconductor device according to any one of claims 1 to 5, wherein the antenna is arranged in a coil.

7. The semiconductor device according to any one of claims 1 to 5,
wherein the element forming layer comprises integrated circuits.

8. The semiconductor device according to any one of claims 1 to 5, wherein the element forming layer is arranged so as to overlap the end of the antenna.

9. The semiconductor device according to any one of claims 1 to 5, wherein the element forming layer and the antenna are horizontally arranged.

10. The semiconductor device according to any one of claims 1 to 5, wherein the power supply wire and the ground wire are formed over different layers.

11. The semiconductor device according to any one of claims 1 to 5, wherein at least one of the power supply wire and the ground wire is arranged in three dimensions.

12. The semiconductor device according to any one of claims 1 to 5, wherein each of the first conductive layer and the second conductive layer comprises an element selected from aluminum, titanium, silver, and copper.

* * * * *